United States Patent
Wang

(10) Patent No.: US 11,602,055 B2
(45) Date of Patent: Mar. 7, 2023

(54) OVERMOLDED COMPONENTS HAVING SUB-FLUSH RESIDUALS

(71) Applicant: Apple Inc., Cupertino, CA (US)

(72) Inventor: Depeng Wang, San Jose, CA (US)

( * ) Notice: Subject to any disclaimer, the term of this patent is extended or adjusted under 35 U.S.C. 154(b) by 98 days.

(21) Appl. No.: 16/354,646

(22) Filed: Mar. 15, 2019

(65) Prior Publication Data
US 2020/0077522 A1     Mar. 5, 2020

Related U.S. Application Data

(60) Provisional application No. 62/726,768, filed on Sep. 4, 2018.

(51) Int. Cl.
| H05K 3/28 | (2006.01) |
| H05K 3/00 | (2006.01) |
| H05K 5/00 | (2006.01) |
| H01M 10/42 | (2006.01) |
| H05K 1/02 | (2006.01) |

(52) U.S. Cl.
CPC ............ *H05K 3/28* (2013.01); *H01M 10/425* (2013.01); *H05K 1/0284* (2013.01); *H05K 3/0026* (2013.01); *H05K 3/0052* (2013.01); *H05K 3/0097* (2013.01); *H05K 5/0034* (2013.01);

(Continued)

(58) Field of Classification Search
None
See application file for complete search history.

(56) References Cited

U.S. PATENT DOCUMENTS

| 2014/0084452 A1 | 3/2014 | Nagamatsu et al. |
| 2014/0287275 A1* | 9/2014 | Hwang ............ H01M 10/0436 |
| | | 429/7 |

(Continued)

FOREIGN PATENT DOCUMENTS

| GB | 2 151 845 A | 7/1985 |
| JP | 2006060125 A | 3/2006 |

(Continued)

OTHER PUBLICATIONS

JP2014186996A_Description_202010141515_Machine_Translation.pdf.*

(Continued)

*Primary Examiner* — Brian R Ohara
*Assistant Examiner* — Patrick Marshall Greene
(74) *Attorney, Agent, or Firm* — Kilpatrick Townsend & Stockton

(57) ABSTRACT

Electronics modules according to embodiments of the present technology may include a circuit board having a first surface from which an electronic component extends and a second surface opposite the first surface. The circuit board may include a tie-bar residual extending from a sidewall of the circuit board beyond the width across the first surface. The modules may also include an overmold at least partially encapsulating the circuit board. The overmold may be characterized by a first height extending normal to the first surface of the circuit board across the width of the circuit board. The overmold may extend laterally beyond the width along a length of the first surface. The overmold may define a region about the tie-bar residual characterized by a recessed height. The overmold may define a notch recessed from an outer edge of the overmold. The notch may be located across the tie-bar residual.

19 Claims, 5 Drawing Sheets

(52) U.S. Cl.
CPC ........... *H01M 2010/4271* (2013.01); *H05K 2203/107* (2013.01); *H05K 2203/1327* (2013.01)

(56) References Cited

U.S. PATENT DOCUMENTS

2015/0062825 A1    3/2015  Ossimitz et al.
2020/0092981 A1*   3/2020  Dan ................... H05K 3/4644

FOREIGN PATENT DOCUMENTS

| JP | 2008277630 A  | 11/2008 |  |
|----|---------------|---------|--|
| JP | 2014186996 A *| 10/2014 | ........ H01M 10/0436 |
| KR | 102017674 B1 *| 9/2019  |  |

OTHER PUBLICATIONS

KR102017674B1_Description_202010141035_Machine_Translation .pdf.*
JP2008277630A—Machine translation (Year: 2008).*
"International Search Report and Written Opinion," dated Jan. 27, 2020 in International Application No. PCT/US2019/047816. 16 pages.
"Invitation to Pay Additional Fees," dated Dec. 3, 2019 in International Application No. PCT/US2019/047816. 10 pages (copy not included).

\* cited by examiner

OVERMOLDED COMPONENTS HAVING SUB-FLUSH RESIDUALS

CROSS-REFERENCE TO RELATED APPLICATIONS

This application claims the benefit of U.S. Provisional Application No. 62/726,768, filed Sep. 4, 2018, entitled "OVERMOLDED COMPONENTS HAVING SUB-FLUSH RESIDUALS", and which is hereby incorporated by reference in its entirety for all purposes.

TECHNICAL FIELD

The present technology relates to overmolding. More specifically, the present technology relates to overmolding electronics components.

BACKGROUND

Microelectronics are incorporated in many devices, which may have small form factors. Producing overmolded components that can be incorporated in these form factors can be challenging.

SUMMARY

Electronics modules according to embodiments of the present technology may include a circuit board having a first surface from which an electronic component extends and a second surface opposite the first surface. The circuit board may be characterized by a width across the circuit board and a thickness. The circuit board may include a tie-bar residual extending from a sidewall of the circuit board beyond the width across the first surface. The modules may also include an overmold at least partially encapsulating the circuit board. The overmold may be characterized by a first height extending normal to the first surface of the circuit board across the width of the circuit board. The overmold may extend laterally beyond the width of the first surface along a length of the first surface. The overmold may define a region about the tie-bar residual characterized by a recessed height from the first height. The overmold may define a notch within the region recessed from an outer edge of the overmold. The notch may be located across the tie-bar residual.

In some embodiments, a surface of the tie-bar residual normal to the first surface of the circuit board along a thickness of the circuit board may be exposed within the notch. The tie-bar residual may be a first tie-bar residual and may extend from a first sidewall of the circuit board. The circuit board may also include a second tie-bar residual extending from a second sidewall of the circuit board opposite the first sidewall of the circuit board. The overmold may further define a second region about the second tie-bar residual characterized by a recessed height from the first height. The overmold may define a second notch within the second region recessed from an outer edge of the overmold. The second notch may be located across the second tie-bar residual. The overmold may be further characterized by a second height extending normal to the second surface of the circuit board across the width of the circuit board. The overmold may extend laterally beyond the width of the second surface along a length of the second surface. The overmold may define a second region about the tie-bar residual characterized by a recessed height from the second height. The notch may be further defined within the second region recessed from an outer edge of the overmold. A thickness of the overmold from the region characterized by a recessed height from the first height to the second region characterized by a recessed height from the second height may be substantially equivalent to the thickness of the circuit board. The notch may be characterized by a length of less than or about 2 mm. The notch may be characterized by a recess depth from an outer edge of the overmold of less than or about 500 μm. The circuit board may be a rigid-flex circuit board, and the overmold may be an epoxy-based compound.

Some embodiments of the present technology may also encompass an electronic system. The system may include a battery cell characterized by a height. The battery cell may include an electrode tab exiting from an edge of a first side of the battery cell. The system may also include a module electrically coupled with the battery cell. The module may include a circuit board including a conductive tab extending from a first side of the circuit board and a flexible coupling extending from a second side of the circuit board normal to the first side of the circuit board. The conductive tab may be electrically coupled with the electrode tab. The circuit board may include a first surface from which an electronic component extends and a second surface opposite the first surface. The circuit board may be characterized by a width across the circuit board, the circuit board may be characterized by a thickness, and the circuit board may include a tie-bar residual extending beyond the width across the first surface from a second side of the circuit board opposite the first side of the circuit board. The module may also include an overmold at least partially encapsulating the circuit board. The conductive tab may penetrate the overmold. The overmold may be characterized by a first height extending normal to the first surface of the circuit board across the width of the circuit board. The overmold may extend laterally beyond the width of the first surface along a length of the first surface. The overmold may define a region about the tie-bar residual characterized by a recessed height from the first height. The overmold may define a notch within the region recessed from an outer edge of the overmold, and the notch may be located across the tie-bar residual.

In some embodiments, a surface of the tie-bar residual normal to the first surface of the circuit board along a thickness of the circuit board may be exposed within the notch. The tie-bar residual may be a first tie-bar residual and extend from the second side of the circuit board. The circuit board may also include a second tie-bar residual extending from the first side of the circuit board. The overmold may further define a second region about the second tie-bar residual characterized by a recessed height from the first height. The overmold may define a second notch within the second region recessed from an outer edge of the overmold. The second notch may be located across the second tie-bar residual. The overmold may be further characterized by a second height extending normal to the second surface of the circuit board across the width of the circuit board. The overmold may extend laterally beyond the width of the second surface along a length of the second surface. The overmold may define a second region about the tie-bar residual characterized by a recessed height from the second height. The notch may be further defined within the second region recessed from an outer edge of the overmold. A thickness of the overmold from the region characterized by a recessed height from the first height to the second region characterized by a recessed height from the second height may be substantially equivalent to the thickness of the circuit board. The notch may be characterized by a length of less than or about 2 mm. The notch may also be characterized by a recess depth from an outer edge of the overmold of less than or about 500 μm. The notch may be separated from the battery cell by less than or about 2 mm.

Some embodiments of the present technology may also encompass methods of separating a microelectronic circuit board. The methods may include applying an overmold to a circuit board coupled with a rigid-flex board. The overmold may at least partially encapsulate the circuit board. The overmold may be characterized by a first height extending normal to a first surface of the circuit board across a width of the circuit board. The overmold may extend laterally beyond the width of the first surface along a length of the first surface. The overmold may define a region about a tie-bar coupling the circuit board to the rigid-flex board, and the region may be characterized by a recessed height from the first height. The methods may include separating the circuit board from the rigid-flex board by cutting a notch within the region recessed from an outer edge of the overmold using laser cutting or mechanical cutting. The notch may be cut along a path through the overmold and the tie-bar in a single cutting operation. The circuit board and overmold may be characterized by a consistent material thickness through the overmold and the tie-bar along the path. In some embodiments, the notch may be characterized by length and width dimensions of less than or about 1 mm.

Such technology may provide numerous benefits over conventional technology. For example, the present systems may produce a module with that recesses surfaces and materials that could otherwise cut or abrade adjacent materials. Additionally, the modules may be trimmed in a way that protects both the overmold material as well as the functional component during the cutting process. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
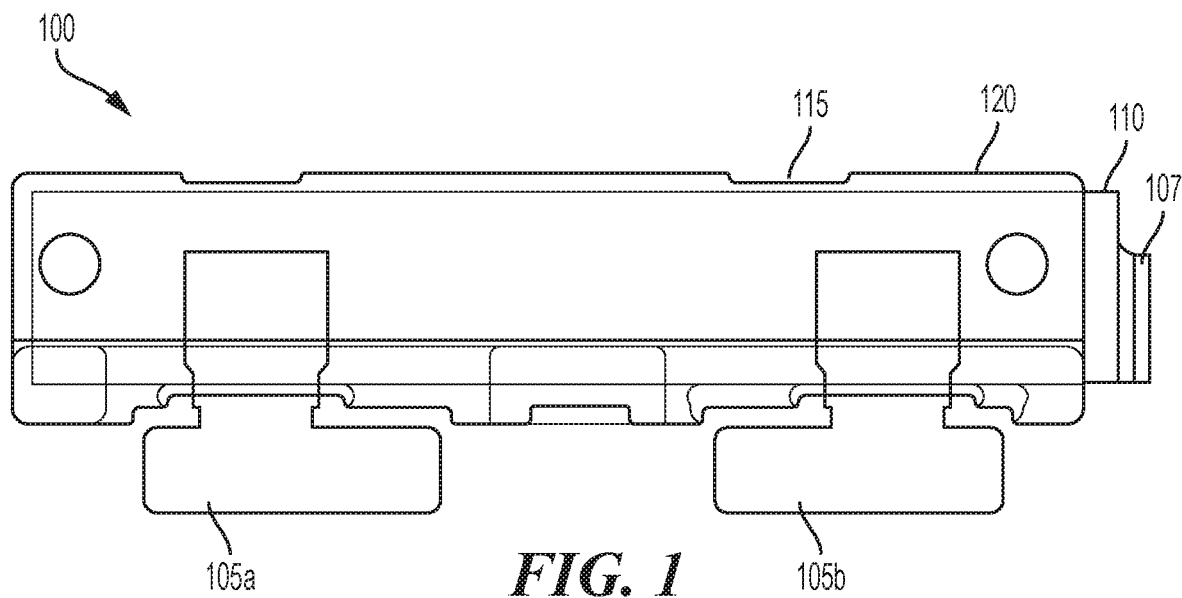
FIG. 1 shows a schematic view of an overmolded electronic component according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Many electronic devices are developed for mobility. For example, computers, mobile devices including phones, wearable devices, and fitness devices may all have size constraints for internal components in order to produce a particular device size. As device designs and configurations change, especially in efforts to reduce device sizes, the available space for internal components may be further constrained. These constraints may include restrictions in available volume as well as the geometry of such a volume. Conventional devices have often been limited to larger form factors to accommodate both a sufficient battery cell and power module, as well as associated electronic operational system components.

Many mobile devices are often dropped or jostled during daily use, which can cause components to shift or contact one another within the device. Some components include fragile or delicate materials, which when contacted may tear. For example, battery pouches, system insulation, and other flexible materials may be cut or damaged if contacted by sharp corners or edges. A system module may be formed from a printed circuit board, which at reduced form factors may have rough or sharp edges. Despite overmolding or other packaging, aspects of the module may still be present that can damage adjacent materials. Moreover, fabrication techniques that could otherwise address these issues on larger form factors may damage either the mold or the functional electronic component at reduced form factors. Conventional technologies have therefore been limited to larger form factors or material constraints to produce adequately protected internal device components.

The present technology may overcome these issues, however, by providing an overmolded component that can be separated from connectors subsequent overmolding even at reduced form factors. The separation process may involve recessing what may otherwise be sharp edges, and thereby protect adjacent components from contact with the components, without further processing of the exposed surfaces. Additionally, the shape of the overmold may be adjusted in some embodiments of the present technology to accommodate delicate separation processes, which could otherwise damage the constituent materials.

Although the remaining portions of the description may reference small form factor components, it will be readily understood by the skilled artisan that the technology is not so limited. The present techniques may be employed with any number of electronic components, battery systems, and devices, which may benefit from the present geometries and processes. Moreover, the present technology may be applicable to batteries and energy storage devices used in any number of technologies that may include, without limitation, phones and mobile devices, watches, glasses, and other wearable technology including fitness devices, handheld electronic devices, laptops and other computers, as well as other devices that may benefit from overmolding designs according to embodiments of the present technology.

FIG. 1 shows a schematic view of an overmolded electronic component 100 according to some embodiments of the present technology, which may be a control module or circuit module for use within an electronic device. Electronic component 100 may in some embodiments be connected with a battery cell, for example, although the overmolding materials and processes discussed can be applied to any number of other circuit or electronic structures, as well as other devices that may benefit from overmolding. When electronic component 100 may be electrically connected with a battery, the module may provide a variety of functionality. For example, the module may monitor a battery cell during charging and discharging operations, and may ensure the battery cell is not overcharged or over-depleted during use. Additionally, the module may monitor overall health of the battery cell to ensure proper functioning. Electronic component 100 may couple with terminals of the battery via one or more conductive tabs 105, including tab 105a and tab 105b, which may couple with one or both of a positive and negative terminal of a battery in order to provide this functionality.

Electronic component 100 may also provide access to an additional electrical connector 107, such as a flexible coupling, that may allow device components to access the battery storage through the electronic component 100. In this way, electronic component 100 may provide a pass-through functionality for delivering power from a coupled battery cell. Consequently, electronic component 100 may be under constant load from the battery cell. The cell may include any of a variety of primary or secondary battery cells that may be connected with the module for providing power to a connected device.

Electronic component 100 may be a circuit module as noted above, and may include a circuit board 110 on which one or more electronic components may be coupled. The circuit board may be a multi-layer printed circuit board, and may be rigid, rigid-flex, or flexible material board. Circuit board 110 may be characterized by a width across the board and a length from connector 107 to an opposite end of the board. The circuit board may be characterized by a thickness, which will be discussed further below, along with one or more tie-bar residuals 115, which may be resultant circuit board sections where the board was connected to a larger rigid-flex circuit board. The tie-bar residuals 115 may extend from one or more sides or sidewalls of the circuit board beyond the width across the circuit board.

Electronic component 100 may also include an overmold 120, which may at least partially encapsulate the circuit board 110. Overmold 120 may be an all-around overmold that covers a first or top surface, a second or bottom surface opposite the first surface, as well as extending about the sidewalls or side surfaces. Overmold 120 may be any number of materials, such as polymeric mold compounds including epoxy molding compounds. Because the electronic component 100 may be incorporated into a device, which may be susceptible to dropping or other contact events, the all-around overmold 120 may be used to protect both the functional component as well as surrounding components. Unlike secondary molding, which may be outer shell molding injected through a component, and single-side molding, such as electronic plastic packaging, all-around overmolding may have challenges as will be discussed below related to addressing tie-bar regions. For reduced form factor components, the overmolding may be performed while the circuit board is still connected to a flex board, as will be described below. Accordingly, the manufacturing process according to embodiments of the present technology may accommodate the tie-bar residuals after separation. As illustrated in FIG. 1, the present overmold may allow a notch to be formed at the tie-bar residual to limit the opportunity for interaction between sharp circuit board edges, and adjacent components.

Overmold 120 may not extend the entire length of the circuit board 110, and may extend towards, but not fully to, an end from which electrical connector 107 may extend. This may occur to afford a clamping region to ensure limited strain on the circuit board during the molding or curing processes, which could otherwise damage the circuit board. As noted above, some embodiments of the present technology may relate to challenges particular to reduced form factors. For example, in some embodiments, circuit board 110 may be less than or about 5 mm wide, and may be less than or about 3 cm in length. Because of the compact design and associated delicacy of the components, standalone overmolding and processing may not be feasible. Consequently, particular operations may be performed to address these issues. It is to be understood, however, that the present techniques and structures may not be limited to such reduced form factors, and may be applicable to any number of larger sized components.

Figure 2:
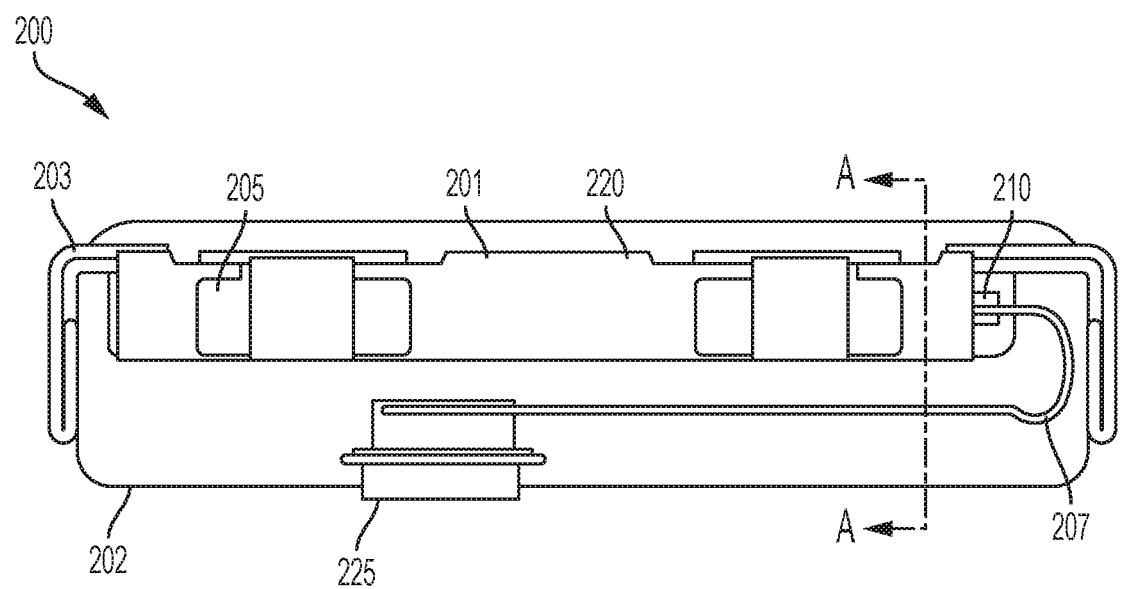
FIG. 2 shows a schematic front elevation view of an electronic device according to some embodiments of the present technology.

FIG. 2 shows a schematic front elevation view of an electronic system 200 according to some embodiments of the present technology. Electronic system 200 may include an electronic module 201, which may include any of the features of electronic component 100 described above, and may illustrate the component when coupled with a battery cell 202. For example, electronic system 200 may include some or all of the components of a battery system incorporated within a wearable or other mobile electronic device, which may be characterized by limited internal capacity and space restrictions for internal components. Electronic system 200 may illustrate a battery system as may be positioned within a device where coupling with a system board may be performed to provide perspective.

As noted, electronic system 200 may include battery cell 202 as well as a module 201. Electronic system 200 may show conductive tabs 205, which may extend laterally outward of electrode tabs illustrated below. Electrode tabs are not visible despite being outside of conductive tabs 205, because electronic system 200 includes an additional insulative tape positioned over the electrode tabs, and which may be included to cover and optionally hold electrode tabs and conductive tabs 205 in place.

As illustrated, mold 220 may not fully encapsulate circuit board 210, although in other embodiments, the mold may fully laterally enclose the circuit board. Flexible coupling 207 may extend from an edge or side of circuit board 210 and/or mold 220 adjacent a side from which conductive tabs 205 may extend from circuit board 210. Flexible coupling 207 may be printed circuit board, flex board, or other circuit materials or cables that may allow electrical transmission as well as communication transmission to and from the individual circuit modules to a system board with which the electronic system may be connected or coupled. Flexible coupling 207 may extend from circuit board 210 in a first direction, and then be curved with a U-bend proximate the circuit board 210. The flexible coupling may curve or be extended vertically to be run back along or substantially parallel to module 201. The flexible coupling 207 may extend along the mold 220 to a lateral position along a length of the module, such as a midpoint, or some interior lateral position along the module 201. Flexible coupling 207 may extend along the mold to or toward a connector 225 by which the electronic system 200 may be connected with a system board as previously described.

As illustrated, this configuration allows the flexible coupling to be maintained within a vertical dimension at least partially defined by battery cell 202. Whereas many conventional designs extend a circuit connection away from a battery cell, the present technology may incorporate the entire module of the system within a volume defined from one position by a terrace of the battery cell 202, and within a height and/or length of the battery cell. Coupling 207 may at least partially extend beyond the height of the battery cell in some embodiments depending on the system connection, although in some embodiments, all module components may be maintained within a volume defined at least partially by a height and lateral width of the battery cell 202.

FIG. 2 also shows an additional aspect of battery cell 202, which may be in accord with some embodiments of the present technology. On a first side of battery cell 202 may be a terrace and electrode tabs with which module 201 may be coupled. On adjacent sides of the battery cell 202, battery cell housing 203 may be closed with a single, double, or multiple fold of the housing material. Battery cell 202, or any other battery cell, may include a pouch enclosure or other enclosure design. Some battery cells may include a conductive material that extends to the edges of the cell along with the housing material. The incorporated layer of conductive material may limit water permeation through what may be a polymeric pouch material. This conductive material, such as a metal, may provide an access for corrosion or shorting if not protected. Accordingly, a fold or multiple folds may be administered to the housing material to limit or prevent an exterior edge from being exposed.

As shown, housing 203 on each lateral side adjacent a front side from which electrode tabs may extend may include a double fold that recesses an edge of the housing material, and any material positioned between a top and bottom layer of the housing material, within a second fold of the housing material. Thus, a first fold may bring the housing material back across itself towards the battery cell 202. Subsequently, a second fold may be performed to bring the first fold vertically against a sidewall of the battery cell, which may maintain the first fold positioned towards an internal surface of the housing material as shown. Any number of additional internal folds or rolls may also be performed in other embodiments to further limit exposure of a sealing edge of the battery cell housing material. Such folding may be performed on any remaining side of the battery cell separate from the side from which the electrode tabs extend, depending on the geometry of the cell, and may not be limited to the opposite sides of the cell as shown, with each adjacent to the first side from which the electrode tabs extend.

Figure 3:
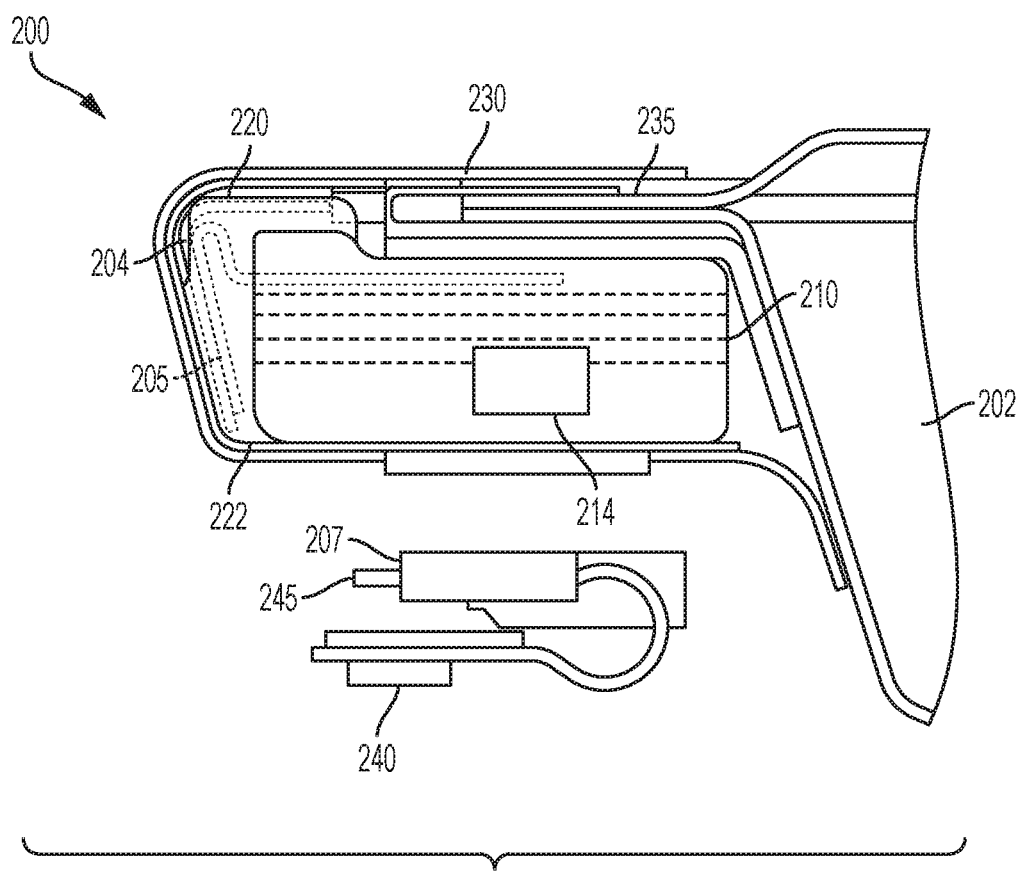
FIG. 3 shows a schematic cross-sectional view along line A-A of FIG. 2 of an electronic device according to some embodiments of the present technology.

FIG. 3 shows a schematic cross-sectional view along line A-A of FIG. 2 of an electronic system 200 according to some embodiments of the present technology. FIG. 3 illustrates additional features of flexible coupling 207 at a distal end from where flexible coupling may couple with circuit board 210. Additionally, FIG. 3 may show an example of electrode tab 204 and conductive tab 205 coupled together and recessed within the overmold 220.

FIG. 3 illustrates many of the same components previously described, and may include any of the components, configurations, or materials of any of the previous figures. The figure includes overmold 220 shown transparently to illustrate how electrode tab 204 and conductive tab 205 may be positioned within a recess 222 of mold 220. In some embodiments, such as illustrated, the bend forming the curvature of electrode tab 204 may be performed further out along a length of the electrode tab, although in some embodiments the tab may be bent directly from a point of exit from the circuit board or mold. In any type of bend, a portion of one or both of electrode tab 204 or conductive tab 205 may extend beyond a front surface of mold 220, before recessing within the mold.

Such a configuration may extend the weld or coupling location of the two tabs to a more distal location of the electrode tab from where it penetrates the battery cell housing. An insulative tape 230 may extend about the module 201 to provide an even front surface, as well as protection for the module. The module may seat on a terrace 235 formed by the battery housing, and may be positioned directly adjacent the battery cell 202. Circuit board 210 may be held within mold 220, and one or more electronic components 214 may extend from a first surface of the circuit board 210.

As previously noted, exposed circuit board tie-bar residuals in a more conventional design may be directly adjacent the pouch of the battery cell or a seating tape on one side of the module 201, and may be directly adjacent an insulating tape 230 on the other side of the module 201. During an event, such as dropping the device in which the system is connected, movement of internal components may occur, which were the tie-bar exposed surface in contact with the pouch or insulating tape, may cause wear, tearing, or abrasions of the materials, which could damage the components. In some embodiments, the battery cell and exposed tie-bar residuals may be within a few millimeters of one another, and thus any movement of components within the device could cause direct contact and possible damage. Accordingly, configurations according to the present technology may form notches or recesses to limit or prevent contact between aspects of the components, as will be described below.

Additionally shown in the figure is an embodiment of the flexible coupling described above. The present view is shown laterally internal to the U-bend of the flexible coupling, but illustrates flexible coupling 207 proximate connector 240. In some embodiments as shown, flexible coupling 207 may be a first flexible coupling. A distal end of first flexible coupling 207 may extend to and be electrically coupled with a second flexible coupling 245. The second flexible coupling 245 may extend partially or substantially perpendicular to the first flexible coupling 207. In some embodiments, second flexible coupling 245 may extend from first flexible coupling 207 back towards the battery cell, which may allow second flexible coupling 245 to be maintained within a volume defined laterally by a length of module 201 as illustrated. Accordingly, the flexible coupling may not extend outward beyond the module in some embodiments. The second flexible coupling 245 may form a U-bend as illustrated proximate the battery cell 202, and may extend back across first flexible coupling 207, such as around the distal end of the first flexible coupling 207. The second flexible coupling 245 may then be electrically coupled with the connector 240 at a distal end of the second flexible coupling 245. Accordingly, the electronic system may be maintained in a constrained form factor and coupled with an additional connector within a volume defined by the height of the battery cell 202 and the area of the module 201. Because of the dimensions and relative proximity of the components, the present technology may produce modules 201 that may recess exposed surfaces of the circuit board from surrounding materials.

Figure 4:
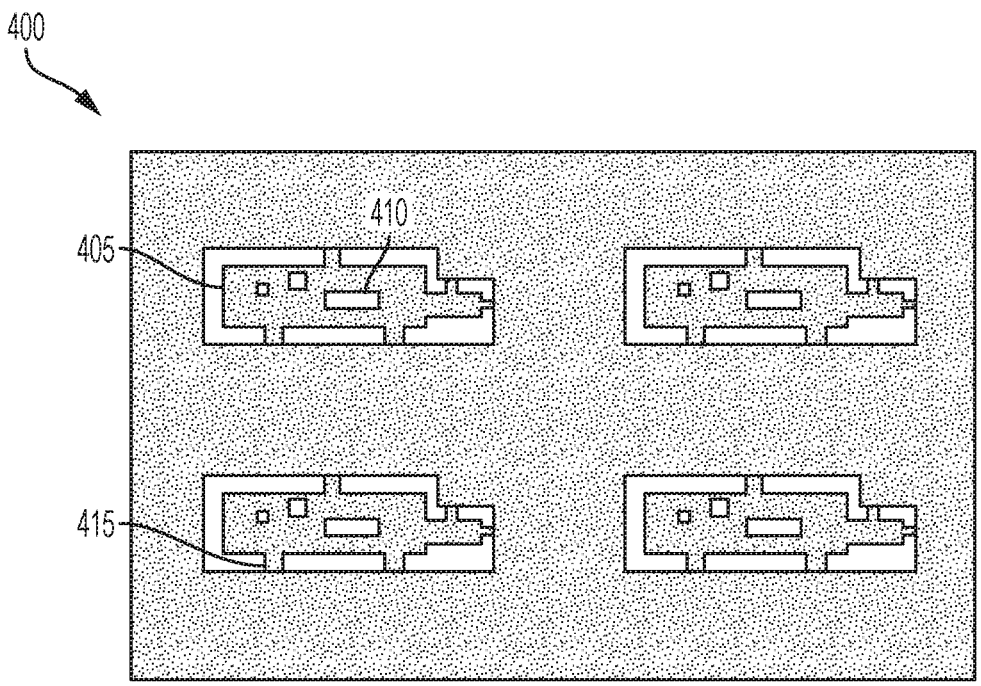
FIG. 4 shows a schematic view of a rigid-flex circuit board according to some embodiments of the present technology.

Turning to FIG. 4 is shown a schematic view of a rigid-flex circuit board 400 according to some embodiments of the present technology. The rigid-flex circuit board 400 may have a number of cut-out circuit boards 405 formed across the surface of the rigid-flex. The circuit boards 405 may be similar to any of the circuit boards previously described. One or more electronic components 410 may be positioned or coupled with a first surface of the circuit boards, although components may extend from either or both major surfaces in some embodiments. As previously discussed, in some embodiments the circuit boards 405 may be characterized by limited dimensions, such as with a width of less than or about 5 mm, and thus electronic components 410 may be within 1 mm of an edge. Delicate processing may be performed to ensure the functional component is not damaged or degraded in processing.

As illustrated, the circuit boards 405 may be coupled with rigid-flex board 400 via one or more tie-bars 415. As surface mounting of electronic components occurs, the tie-bars may ensure adequate control and rigidity is maintained, and may limit any damage, strain, or tension that may otherwise be applied to the circuit boards during fabrication. Although any number of processing operations may be performed, in some embodiments after the electronic components are mounted on the circuit boards, the boards may undergo an overmolding operation, by which an overmold is applied or formed about the circuit board.

In some embodiments, the circuit boards may be separated from the rigid-flex board. However, in such a scenario, coupling or clamping of the board may only occur from one end, such as near the flexible coupling. Many molds may not afford adequate coupling availability, such as with widths of a few millimeters or less, and the single point of clamping may produce strain on the end, which may damage the connections. Conventional plastic packaging can be performed on such reduced dimensions, however, plastic packaging is formed on a single side of the electronic device, which allows complete support to be provided beneath the electronic device. For electronic devices according to some embodiments of the present technology, the overmold is to be formed all about the functional component, and thus conventional packaging techniques may be unsuitable to fully encapsulate the majority of the component. Accordingly, in some embodiments, the overmolding operation may be performed while the circuit board is still connected to the rigid-flex circuit board 400.

Figure 5:
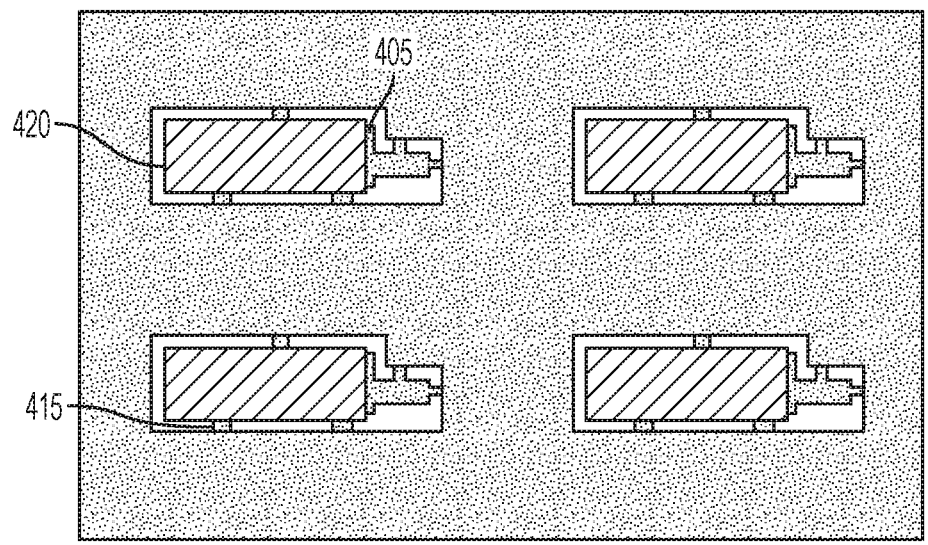
FIG. 5 shows a schematic view of a rigid-flex circuit board according to some embodiments of the present technology.

FIG. 5 shows a schematic view of rigid-flex circuit board 400 according to some embodiments of the present technology. As illustrated, an overmold 420 has been formed about circuit boards 405. The circuit boards 405 may be coupled with the rigid-flex board 400 with tie-bars 415, which may extend through the overmold 420 as illustrated. This may afford stability to the circuit board during the overmolding operation to prevent or limit damage to the electronics. Additionally, the mold may clamp over a distal location of the circuit board near the flexible coupling material described above, which may produce a gap region at a longitudinal edge of the circuit board. Thus, the overmold may not fully encapsulate the circuit board, but may substantially encapsulate the circuit board, such as about at least two sides, or about three sides, less the tie bars extending through the overmold. Once the overmolding process has been performed, the circuit boards 405 may be cut from the rigid-flex circuit board 400.

In some embodiments the tie-bars may be of limited dimensions, although the circuit board components may be of any dimension in other embodiments. When used in devices as previously explained, the tie bars may be less than one millimeter in width, or less than half a millimeter, for example, which may limit cutting options. For example, many cutting tools based on a compressive mechanism may produce an amount of force that may damage the circuit board, or may cause fractures through the board. Accordingly, laser cutting may be performed in some embodiments to separate the circuit board from the rigid-flex circuit board. Mechanical cutting may also be performed in some embodiments.

As previously explained, the singular circuit boards may be used in any number of devices, and may be positioned proximate or directly adjacent more flexible materials, such as battery cell pouches, which may be cut or torn by sharp residual edges after the tie bars have been cut. Larger scale fabrication may allow smoothing or other operations to be performed to subsequent the separation to modify the exposed surface of the tie-bar residual. At reduced form factors according to some embodiments of the present technology, the circuit board may not be capable of additional processing due to fragility of the components and materials. Moreover, once separated from the rigid-flex circuit board, the circuit boards may be of a dimensional scale that cannot be supported by processing apparatuses to allow further processing. Accordingly, in some embodiments, the cut through the tie bars may be performed to produce a notch that may recess exposed surfaces of the tie bar. Thus, although a rough surface on the exposed portion of the circuit board at the tie-bar residual may be present, this portion may be recessed within the overmold dimensions to limit or prevent the possibility of contact with surrounding components even during events in which the internal components may shift or bump together.

However, to produce a notch design, part of the cutting process may also cut the material of the overmold, such as a polymeric material as previously described. In some embodiments the cut being performed may not exceed one millimeter in any lateral dimension, and thus a finely controlled laser may be used. Although a laser may be tuned to cut the tie-bar, when the same cutting process additionally cuts the overmold, the laser may not be sufficiently tuned to adequately cut the overmold, which may be several times thicker. For example, the circuit board including the tie-bar may be a few hundred micrometers in thickness. The overmold, however, may be much thicker across the circuit board to provide adequate protection of the internal components. A laser for cutting the thin circuit boards, when used on the overmold may require additional time for cutting, or may require a more powerful laser to penetrate the thickness, and which may heat the surrounding material. This may cause the overmold polymer to burn or bubble, which may affect the external dimensions or damage the material. Additionally, as the electronic components may reside proximate lateral edges of the circuit board, the heat generated has been shown to degrade operation of the components or damage the components leading to scrapped devices.

Figure 6:
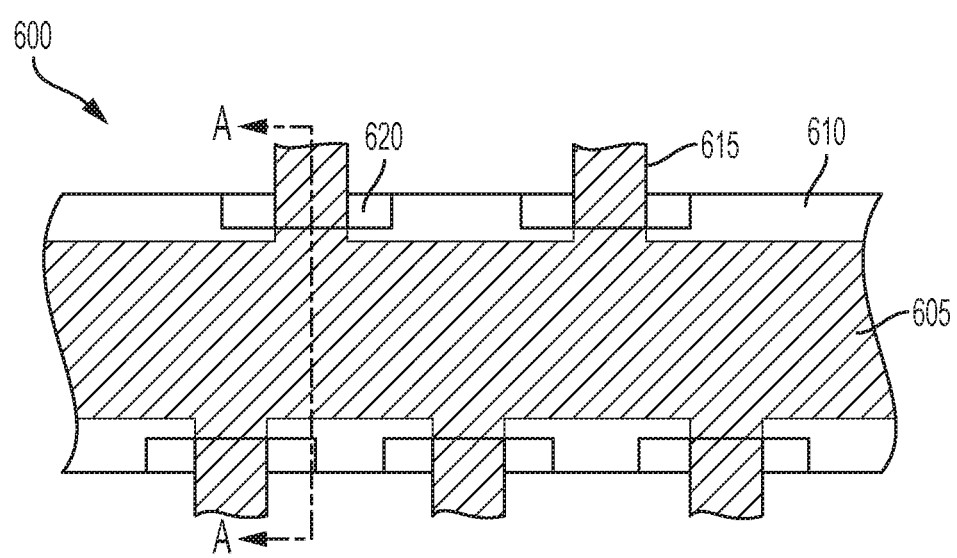
FIG. 6 shows a schematic view of an overmolded circuit board according to some embodiments of the present technology.

To accommodate these issues, in some embodiments of the present technology, regions of the overmold may be adjusted to produce relatively equivalent dimensions of the overmold at the tie bars, which may facilitate cutting. FIG. 6 shows a schematic view of an overmolded circuit module 600 according to some embodiments of the present technology. The schematic illustrates a circuit board 605 and an overmold 610, which may include any of the features, materials, or characteristics previously described. Tie bars 615 are shown extending through overmold 610, and may illustrate a circuit board still attached to a rigid-flex board as previously described. It is to be understood that the figure is included to illustrate the tie bar design, and configurations according to the present technology may include any number of tie bars including more or less than illustrated. The figure also illustrates an exemplary profile of the overmold 610 about the tie bars. As illustrated, and discussed below with FIG. 7, the overmold 610 may include regions 620 characterized by a recessed height of the overmold 610 to facilitate a cutting operation through the materials.

Figure 7:
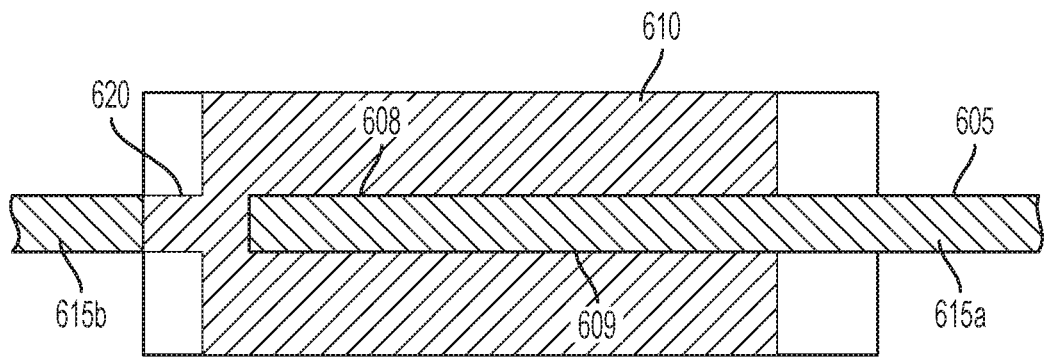
FIG. 7 shows a schematic cross-sectional view along line A-A of FIG. 6 of an overmolded circuit board according to some embodiments of the present technology.

FIG. 7 shows a schematic cross-sectional view along line A-A of FIG. 6 of an overmolded circuit board 600 according to some embodiments of the present technology. The view shows both circuit board 605 and overmold 610, as well as two tie bars 615 extending from the circuit board 605 at opposite sides of the circuit board, and which may connect the circuit board to a rigid-flex circuit board as previously described. As illustrated, the figure includes a cross-section that bisects the circuit board 605 through a first tie bar 615a, and extends through region 620 proximate a second tie bar 615b, without intersecting the tie bar.

Circuit board 605 may include a first surface 608 and a second surface 609 opposite the first surface 608. Although not illustrated, it is to be understood that one or more electronic components may extend from one or both sides of the circuit board 605 as previously described. Circuit board 605 may be characterized by a width across the circuit board between tie bars, and may be characterized by a thickness through the circuit board 605. The tie bars 615 may extend beyond the width of the circuit board. Overmold 610 can be seen to be characterized by a first height extending normal to the first surface 608 across the width of the circuit board, and may be characterized by a second height extending normal to the second surface 609. In some embodiments the first height and the second height may be the same. It is to be understood that the exterior surface of the overmold 610 may be characterized by features, which may be artifacts of the mold, for example, and may create a non-uniform height profile. Regardless, the first height may be beyond a threshold height across the circuit board, such as a height greater than the thickness of the circuit board, for example, although any height producing a protective overmold may be incorporated with devices according to embodiments of the present technology.

Overmold 610 may extend laterally beyond the width of the circuit board on both sides of the circuit board along a length of the circuit board, as illustrated, and may extend at least partially along the tie bars 615. Overmold 610 may also define regions 620 about the tie bars. For example a region 620 may be defined about each tie bar, which may be formed to accommodate a cutting operation as previously explained. Region 620, or regions depending on the number of tie bars, may be characterized by reduced height in the area of the overmold 610 about the tie bars. For example, overmold 610 may be characterized by a reduced height from the first height towards the surface 608 in a first portion of the region, or in some embodiments within a first region, and may be characterized by a reduced height from the second height towards the second surface 609 in a second portion of the region, or in some embodiments within a second region associated with the opposite side of the tie bar.

In some embodiments the region or regions may extend about the tie bars to a dimension to accommodate a cutting path for a laser, which may maintain the cutting path within the region and recessed material height of the overmold 610. Thus the region may extend laterally beyond the tie bars parallel with the length of the circuit board at least or about 10% the width of the tie bar on either side of the tie bar, and may extend at least or about 20% the width, at least or about 30% the width, at least or about 40% the width, at least or about 50% the width, at least or about 75% the width, at least or about 100% the width, or more depending on the width of the tie bar, for example. The regions may be characterized by a similar width dimension of the overmold as other regions. For example, as illustrated, the overmold material within the regions 620 still extends to a similar outer dimension to produce a consistent or substantially consistent outer dimension of the overmold material.

The height of the overmold material within the regions 620 may be related to the thickness of the circuit board to be cut. For example, the overmold material may be formed to expose the tie bar within the region, and thus may be an equivalent height as the circuit board, or put another way, may be characterized by a thickness through the overmold material substantially or essentially equal to the thickness of the circuit board. In other embodiments, the thickness may be less than or about 1% greater than the thickness of the circuit board, and may be less than or about 2% greater than the thickness, less than or about 3% greater than the thickness, less than or about 4% greater than the thickness, less than or about 5% greater than the thickness, less than or about 6% greater than the thickness, less than or about 7% greater than the thickness, less than or about 8% greater than the thickness, less than or about 9% greater than the thickness, less than or about 10% greater than the thickness, or more, although when extending further about the tie bar the cutting operation may cause burning of the overmold material or heat-related issues as previously described.

Figure 8:
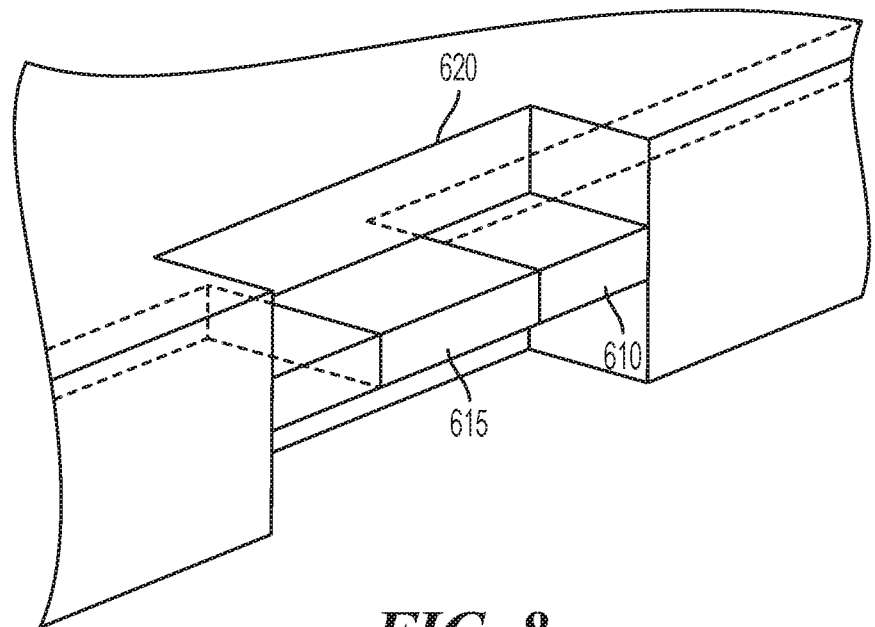
FIG. 8 shows a schematic perspective view of an overmolded circuit board according to some embodiments of the present technology.

FIG. 8 shows a schematic perspective view of an overmolded circuit board 600 according to some embodiments of the present technology. FIG. 8 may show another view of region 620 illustrating the comparable thickness of the overmold 610 material to the circuit board tie bar 615 within the region. Hence, a cutting operation performed within the region may consistently cut a particular thickness throughout the path of cutting. Indeed, in some embodiments, the cutting operation through the overmold material may be easier than through the tie bar when the overmold material is a similar thickness. Because the tie bar may include multiple layers, including a copper layer, for example, and the overmold material may be an epoxy polymer, for example, the cutting may be facilitated with the thinner overmold material, which may allow a laser tuned specifically to the tie bar. This may ensure the circuit board and overmold material are protected during the cutting.

Figure 9:
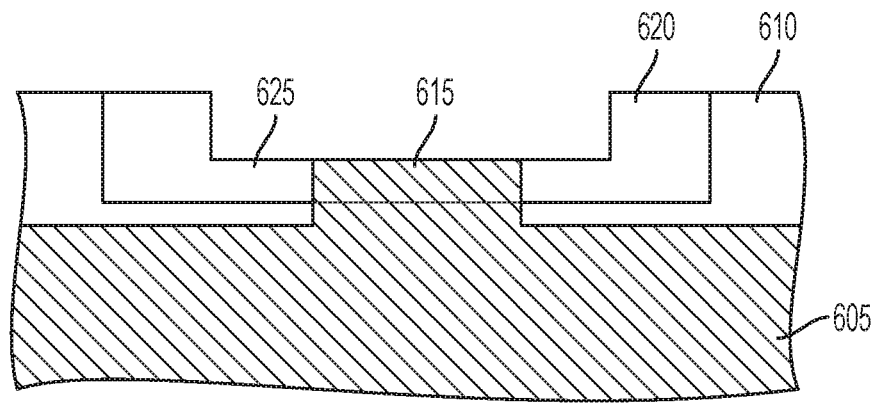
FIG. 9 shows a schematic view of an overmolded circuit board according to some embodiments of the present technology.

FIG. 9 shows a schematic view of an overmolded circuit board 600 according to some embodiments of the present technology. FIG. 9 may illustrate after a cutting operation has been performed, and may show a notch 625, which may be defined within the region 620 and recessed from an outer edge of the overmold 610. Notch 625 may be fully contained within region 620, and may extend across the tie bar 615 leaving a tie-bar residual extending from the width of the circuit board a distance less than the outer dimension of the overmold material. The cutting operation may be performed in a single processing operation, for example, and in one embodiment a laser may extend in a rectilinear path through the materials. In other embodiments multiple cuts may be made, although by performing a single cutting operation, heat effects and material damage may be limited or avoided. For example, the laser may trace a path recessing within the overmold material, laterally through the material, the tie bar, and additional material, and then extend back out of the region.

The tie-bar residual may be exposed within the notch in embodiments after the separation from the rigid-flex board. Across a surface of the tie bar normal to the two main surfaces of the circuit board, the entire tie bar residual face may be exposed. In conventional, non-recessed designs, this may produce a surface profile that may damage surrounding components. However, in some embodiments, the notch may be characterized by dimensions that limit the opportunity for adjacent materials to be contacted by the residual tie bar surface. For example, the notch may be characterized by dimensions such that during an event where the module is brought in contact with the adjacent battery cell, for example, the dimensions of the notch may be less than an available deflection or compressive bowing of the pouch material.

For example, when a softer material is pressed against a notch of a harder material, the softer material may bow outward between the two contact points. The closer the contact points, the more material characteristics may prevent any outward bowing. Accordingly, in some embodiments the notch may be characterized by a length of less than or about 5 mm, and may be characterized by a length of less than or about 4 mm, less than or about 3 mm, less than or about 2 mm, less than or about 1 mm, or less. Consequently, the recess may be nominal as the adjacent material may be incapable of penetrating the recess. Accordingly, the depth of the recess from an outer edge of the overmold material may be less than or about 500 µm, and may be less than or about 400 µm, less than or about 300 µm, less than or about 200 µm, less than or about 100 µm, less than or about 75 µm, less than or about 50 µm, or less. In an electronic device, such as described above, the notch may be less than or about 5 mm from a battery cell pouch or insulating tape, and may be less than or about 4 mm from the component, less than or about 3 mm from the component, less than or about 2 mm from the component, less than or about 1 mm from the component, or less. Despite the proximity, the pouch or other material may not contact the exposed tie-bar residual, even during dropping or other jostling events.

Figure 10:
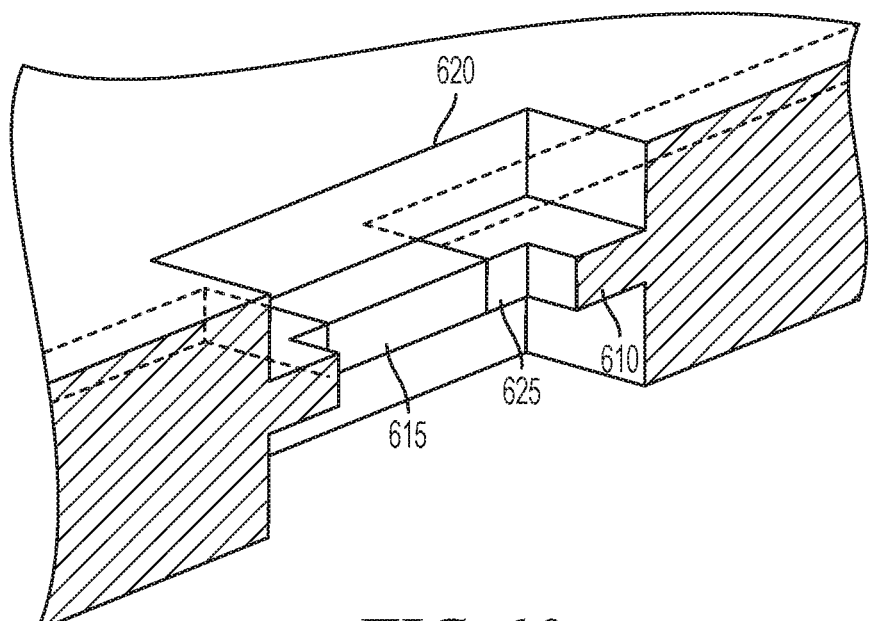
FIG. 10 shows a schematic perspective view of an overmolded circuit board according to some embodiments of the present technology.

FIG. 10 shows a schematic perspective view of overmolded circuit board 600 according to some embodiments of the present technology. The figure shows notch 625 relative to the region 620 of reduced height. As illustrated, the notch 625 recesses within region 620 of the overmolded material 610. Although tie-bar residual 615 may be fully exposed within the notch, due to the reduced dimensions of the notch, surrounding and adjacent materials may be protected from damage or contact with the exposed materials. By producing overmold regions according to some embodiments of the present technology, cutting operations may be facilitated for all-around overmolding on microelectronic components by maintaining mold dimensions similar to the tie bars to be cut. Additionally, notches formed may protect adjacent materials and components without requiring additional operations to attempt to smooth the exposed tie-bar residuals, especially at dimensions where additional operations may damage delicate circuit boards.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the cell" includes reference to one or more cells and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A circuit module comprising:
    a circuit board comprising a first surface from which an electronic component extends and a second surface opposite the first surface, wherein the circuit board is characterized by a width across the circuit board, wherein the circuit board is characterized by a thickness, and wherein the circuit board is formed from rigid-flex circuit board material and comprises a tie-bar residual of the rigid-flex circuit board material extending from a sidewall of the circuit board beyond the width across the first surface; and
    an overmold at least partially encapsulating the circuit board, wherein the overmold is characterized by a first height extending normal to the first surface of the circuit board across the width of the circuit board, wherein the overmold extends laterally beyond the width of the first surface along a length of the first surface, wherein the overmold defines a region about the tie-bar residual characterized by a recessed height from the first height, wherein the overmold defines a notch within the region recessed from an outer edge of the overmold, wherein the notch is located across the tie-bar residual, and wherein an outer face of the tie-bar residual is aligned with a portion of an outer surface of the notch.

2. The circuit module of claim 1, wherein the outer face of the tie-bar residual is oriented normal to the first surface of the circuit board along a thickness of the circuit board that is exposed within the notch.

3. The circuit module of claim 1, wherein the tie-bar residual is a first tie-bar residual and extends from a first sidewall of the circuit board, and wherein the circuit board further comprises a second tie-bar residual extending from a second sidewall of the circuit board opposite the first sidewall of the circuit board.

4. The circuit module of claim 3, wherein the overmold further defines a second region about the second tie-bar residual characterized by a recessed height from the first height, wherein the overmold defines a second notch within the second region recessed from an outer edge of the overmold, and wherein the second notch is located across the second tie-bar residual.

5. The circuit module of claim 1, wherein the overmold is further characterized by a second height extending normal to the second surface of the circuit board across the width of the circuit board, wherein the overmold extends laterally beyond the width of the second surface along a length of the second surface, wherein the overmold defines a second region about the tie-bar residual characterized by a recessed height from the second height, wherein the notch is further defined within the second region recessed from an outer edge of the overmold.

6. The circuit module of claim 5, wherein a thickness of the overmold from the region characterized by a recessed height from the first height to the second region characterized by a recessed height from the second height is substantially equivalent to the thickness of the circuit board.

7. The circuit module of claim 1, wherein the notch is characterized by a length of less than or about 2 mm.

8. The circuit module of claim 7, wherein the notch is characterized by a recess depth from an outer edge of the overmold of less than or about 500 μm.

9. The circuit module of claim 1, wherein the overmold is an epoxy-based compound.

10. An electronic system comprising:
a battery cell characterized by a height, wherein the battery cell includes an electrode tab exiting from an edge of a first side of the battery cell; and
a module electrically coupled with the battery cell, the module comprising:
a circuit board including a conductive tab extending from a first side of the circuit board and a flexible coupling extending from a second side of the circuit board normal to the first side of the circuit board, wherein the conductive tab is electrically coupled with the electrode tab, wherein the circuit board comprises a first surface from which an electronic component extends and a second surface opposite the first surface, wherein the circuit board is characterized by a width across the circuit board, wherein the circuit board is characterized by a thickness, and wherein the circuit board is formed from rigid-flex circuit board material and comprises a tie-bar residual of the rigid-flex circuit board material extending beyond the width across the first surface from a second side of the circuit board opposite the first side of the circuit board, and
an overmold at least partially encapsulating the circuit board, wherein the conductive tab penetrates the overmold, wherein the overmold is characterized by a first height extending normal to the first surface of the circuit board across the width of the circuit board, wherein the overmold extends laterally beyond the width of the first surface along a length of the first surface, wherein the overmold defines a region about the tie-bar residual characterized by a recessed height from the first height, wherein the overmold defines a notch within the region recessed from an outer edge of the overmold, wherein the notch is located across the tie-bar residual, and wherein an outer face of the tie-bar residual is aligned with a portion of an outer surface of the notch.

11. The electronic system of claim 10, wherein the tie-bar residual is a first tie-bar residual and extends from the second side of the circuit board, and wherein the circuit board further comprises a second tie-bar residual extending from the first side of the circuit board.

12. The electronic system of claim 11, wherein the overmold further defines a second region about the second tie-bar residual characterized by a recessed height from the first height, wherein the overmold defines a second notch within the second region recessed from an outer edge of the overmold, and wherein the second notch is located across the second tie-bar residual.

13. The electronic system of claim 10, wherein the overmold is further characterized by a second height extending normal to the second surface of the circuit board across the width of the circuit board, wherein the overmold extends laterally beyond the width of the second surface along a length of the second surface, wherein the overmold defines a second region about the tie-bar residual characterized by a recessed height from the second height, wherein the notch is further defined within the second region recessed from an outer edge of the overmold.

14. The electronic system of claim 13, wherein a thickness of the overmold from the region characterized by a recessed height from the first height to the second region characterized by a recessed height from the second height is substantially equivalent to the thickness of the circuit board.

15. The electronic system of claim 10, wherein the notch is characterized by a length of less than or about 2 mm, and wherein the notch is characterized by a recess depth from an outer edge of the overmold of less than or about 500 μm.

16. The electronic system of claim 15, wherein the notch is separated from the battery cell by less than or about 2 mm.

17. A method of separating a microelectronic circuit board, the method comprising:
applying an overmold to a circuit board coupled with a rigid-flex board, wherein the overmold at least partially encapsulates the circuit board, wherein the overmold is characterized by a first height extending normal to a first surface of the circuit board across a width of the circuit board, wherein the overmold extends laterally beyond the width of the first surface along a length of the first surface, wherein the overmold defines a region about a tie-bar of rigid-flex circuit board material coupling the circuit board to the rigid-flex board, the region characterized by a recessed height from the first height; and
separating the circuit board from the rigid-flex board by cutting a notch within the region recessed from an outer edge of the overmold, wherein the notch is cut along a path through the overmold and the tie-bar in a single cutting operation, wherein the circuit board and overmold are characterized by a consistent material thickness through the overmold and the tie-bar along the path, and wherein an outer face of the tie-bar residual is aligned with a portion of an outer surface of the notch.

18. The method of claim 17, wherein the notch is characterized by length and width dimensions of less than or about 1 mm.

19. The circuit module of claim 5, wherein the overmold defines the notch within the region about a first side of the tie-bar residual, wherein the overmold defines a second notch within a second region about a second side of the tie-bar residual.

\* \* \* \* \*